United States Patent [19]
Koishikawa

[11] Patent Number: 5,633,521
[45] Date of Patent: May 27, 1997

[54] ENHANCEMENT OF BREAKDOWN VOLTAGE IN MOSFET SEMICONDUCTOR DEVICE

[75] Inventor: Yukimasa Koishikawa, Tokyo, Japan

[73] Assignee: NEC Corporation, Tokyo, Japan

[21] Appl. No.: 657,435

[22] Filed: Jun. 3, 1996

[30] Foreign Application Priority Data

Jun. 1, 1995 [JP] Japan .................................. 7-135000

[51] Int. Cl.$^6$ .................. H01L 29/76; H01L 29/94; H01L 31/062; H01L 31/113
[52] U.S. Cl. .................. 257/336; 257/339; 257/409; 257/496
[58] Field of Search .................................. 257/339, 401, 257/409, 496, 901, 344

[56] References Cited

U.S. PATENT DOCUMENTS 3,845,495  10/1974  Cauge et al. ............................ 257/339
5,258,636  11/1993  Rumennik et al. ...................... 257/339

FOREIGN PATENT DOCUMENTS 92120030  6/1993  European Pat. Off. ................ 257/339
356133871  10/1981  Japan ..................................... 257/339
405121738  5/1993  Japan ..................................... 257/339

Primary Examiner—Stephen Meier
Assistant Examiner—Ida M. Soward
Attorney, Agent, or Firm—Sughrue, Mion, Zinn, Macpeak & Seas

[57] ABSTRACT

The present invention provides a MOSFET semiconductor device having a higher breakdown voltage. The MOSFET semiconductor device includes a p-type substrate having an n-type drain region, an n$^-$-type drain region located adjacent to the n-type drain region, an n$^+$-type drain layer located within the n-type drain region and at a surface of the p-type substrate, a p-type top layer located adjacent to the n$^-$-type drain region and at a surface of the p-type substrate, an n$^+$-type source region and a p$^+$-type back gate, and a layout pattern constituted of the above mentioned regions and layers includes straight portions and curved portions. The MOSFET semiconductor device is characterized by that the n-type drain region is formed so that the n-type drain region overlaps the p-type top layer in the straight portions of the layout pattern and does not overlap the p-type top layer in the curved portions of the layout pattern.

8 Claims, 9 Drawing Sheets

2 (HATCHED AREA)

2 (HATCHED AREA)

ENHANCEMENT OF BREAKDOWN VOLTAGE IN MOSFET SEMICONDUCTOR DEVICE

BACKGROUND OF THE INVENTION

1. Field of the Invention

The invention relates to the enhancement of a breakdown voltage between drain and source in a MOSFET semiconductor device.

2. Description of the Related Art

A conventional MOSFET semiconductor device has been proposed in Japanese Unexamined Patent Publication No. 55-108773, and is illustrated in FIGS. 1A to 1C, in which FIG. 1B is a plan view illustrating a layout pattern of a conventional MOSFET semiconductor device, FIG. 1A is a common cross-sectional view taken along the lines A—A and B—B, and FIG. 1C is a plan view of a conventional MOSFET semiconductor device, showing an area in which an n-type drain region is formed.

As illustrated in FIG. 1A, a conventional MOSFET semiconductor device includes a p-type substrate 1 which is comprised of an n-type drain region 2, an $n^+$-type drain layer 3 located within the n-type drain region 2 and located at a surface of the p-type substrate 1, an $n^-$-type drain region 5 located adjacent to the n-type drain region 2, a p-type top layer 6 located adjacent to both the $n^-$-type drain region 5 and the n-type drain region 2, and located at a surface of the p-type substrate 1, an $n^+$-type source region 9 spaced away from the $n^-$-type drain region 5 and located at a surface of the p-type substrate 1, and a $p^+$-type back gate 10 located adjacent to the $n^+$-type source region 9 and at a surface of the p-type substrate 1.

An insulating film 7 is formed on a surface of the p-type substrate 1, covering the p-type top layer 6, the $n^-$-type drain region 5 and an exposed surface of the p-type substrate 1. On the insulating film 7 is formed a gate electrode 8 bridging over the $n^-$-type drain region 5 and the $n^+$-type source region 9. The p-type substrate 1 is covered with an interlayer insulating film 12, on which there are formed a drain electrode 4 communicating to the $n^+$-type drain layer 3, and a source electrode 11 communicating to both the $n^+$-type source region 9 and the $p^+$-type back gate 10.

The n-type drain region 2 is formed so that the n-type drain region 2 is present beneath the entire p-type top layer 6, as indicated with hatching in FIG. 1C.

In the conventional MOSFET semiconductor device having the above mentioned structure, when a voltage is applied across the $n^+$-type drain layer 3 and both the $n^+$-type source region 9 and the $p^+$-type back gate 10, there is also a voltage applied across both the p-type substrate 1 and the p-type top layer 6 and both the $n^-$-type drain region 5 and the n-type drain region 2, resulting in an expanded depletion layer in the $n^-$-type drain region 5 and the n-type drain region 2.

In the conventional MOSFET semiconductor device, a layout pattern to be formed on a chip is designed to have a folded pattern in order to increase the density in an area of a chip. For example, as illustrated in FIG. 1B, a layout pattern constituted of the above mentioned regions 2, 5 and 9, layers 3 and 6, and $p^+$-type back gate 10 is comprised of elongated straight portions S running parallel to each other and a curved portion C, forming a radius around the end of the p+-type back gate 10 and n+-type source. A similar curve could be found near the terminus of a drain region, as shown (for example) in FIG. 5B.

It has been found that a breakdown voltage between the p-type top layer 6 and both the n-type drain region 2 and the p-type substrate 1, measured in proximity to the curved portion C when a voltage is applied across the drain electrode 4 and the source electrode 11, is lower than a breakdown voltage measured in the straight portions S in the same condition. The reason for this phenomenon is as follows.

A width of a depletion layer formed when a p-n junction is reverse biased is determined so that negative charges of electrons are balanced in absolute value with positive charges of holes within a diffusion layer. Consider a pattern having a straight elongated portion S and a curved portion C, as illustrated in FIG. 2.

The pattern is constituted of an n-type region and a p-type region that extend adjacent to and in parallel with each other in stepped-junction fashion. Suppose that an electron content of the n-type region is equal to a hole content of the p-type region. In the illustrated pattern, in order to accomplish the above mentioned condition that charges are equal in the p- and n-type regions, a width W1 of a depletion layer D1 formed in the p-type region has to be equal to a width W2 of a depletion layer D2 formed in the n-type region (W1=W2).

However, in order for the negative charges of electrons to be equal to the positive charges of holes in the curved portion C, a width W3 of a depletion layer D3 of the p-type region has to be smaller than a width W2 of a depletion layer D4 of the n-type region (W3<W2=W1). Thus, the width W3 of the depletion layer D3 in the curved portion C is smaller than the width W1 of the depletion layer D1 in the straight portion S (W3<W1), which means that the total width $W_c$ of a depletion layer in the curved portion C is smaller than the total width $W_s$ of a depletion layer in the straight portion S ($W_c < W_s$). As a result, an electric field having greater intensity is applied to the depletion layer D3 formed in the p-type region in the curved portion C. Accordingly, semiconductor in the proximity to the curved portion C inevitably has a smaller breakdown voltage.

According to experiments, for instance, the straight elongated portion S can have a breakdown voltage of about 600 V, whereas the curved portion C can have a breakdown voltage of merely about 400 V. Thus, a breakdown voltage of an entire MOSFET semiconductor device is determined in accordance with a breakdown voltage of a curved portion. For instance, the MOSFET semiconductor device could have a breakdown voltage of about 400 V in the above mentioned case, rather than the more desirable 600 V.

U.S. Pat. No. 5,258,636 issued to Rumennik et al. on Nov. 2, 1993 has suggested a method of enhancing a breakdown voltage in a curved portion of a semiconductor device which is similar in structure to one disclosed in the above mentioned Japanese Unexamined Patent Publication No. 55-108773. However, it is impossible to form a channel in the curved portion in the device disclosed in U.S. Pat. No. 5,258,636, and hence there arises the unavoidable problem of increased resistance between a drain and a source when a MOSFET is turned on.

As has been explained, a breakdown voltage between a drain and a source is determined by the breakdown voltage in the vicinity of the curved portion C in a device having been suggested in Japanese Unexamined Patent Publication No. 55-108773. Thus, the problem is that a MOSFET semiconductor device has to have a smaller breakdown voltage than that of a device having no curved portions.

The method suggested in U.S. Pat. No. 5,258,636 has the unavoidable problem of increased drain to source resistance.

SUMMARY OF THE INVENTION

In view of the above mentioned problems of the prior art, it is an object of the present invention to provide a MOSFET semiconductor device which is capable of avoiding a breakdown voltage between a drain and a source from being reduced without increasing the resistance between a drain and a source.

The present invention provides a MOSFET semiconductor device including a p-type substrate having: an n-type drain region; an n⁻-type drain region located adjacent to the n-type drain region; an n⁺-type drain layer located within the n-type drain region and at a surface of the p-type substrate; a p-type top layer located adjacent to the n⁻-type drain region and at a surface of the p-type substrate; an n⁺-type source region spaced away from the n⁻-type drain region and a p⁺-type back gate, located adjacent to the n⁺-type source region a layout pattern constituted of the above mentioned regions and layers including straight portions and curved portions. In the curved portions of the layout pattern, the p-type top layer is formed within the n⁻-type drain region, and the n-type drain region is formed so it does not overlap the top p-type layer. In non-curved regions, e.g., in elongated straight sections, the top p-type layer is adjacent to both the n-type drain and the n⁻-type drain, and the n-type drain region does overlap the p-type top layer.

In a specific embodiment, the n⁺-type drain layer, the n-type drain region, the p-type top layer, the n⁻-type drain region, the p-type substrate, the n⁺-type source region, and the p⁺-type back gate are arranged in this order when the layout pattern is viewed from above, the p⁺-type back gate being disposed inwardly toward the center of the radius of the curved portions of the layout pattern.

It is preferable that the n-type drain region is located surrounding the n⁺-type drain layer and the p-type top layer is located surrounding the n-type drain region, and the n⁻-type drain region, the p-type substrate, the n⁺-type source region, the p⁺-type back gate are arranged outside the p-type top layer in this order, in which case the n-type drain region is designed to be located beneath the n⁺-type drain layer and the p-type top when formed in the straight portion of the layout pattern.

The present invention further provides a MOSFET semiconductor device having a p-type substrate including an n-type drain region, an n⁻-type drain region located adjacent to the n-type drain region, an n⁺-type drain layer located within the n-type drain region and at a surface of the p-type substrate, a p-type top layer located adjacent to the n⁻-type drain region and at a surface of the p-type substrate, an n⁺-type source region, and a p⁺-type back gate, a layout pattern constituted of the above mentioned regions and layers including straight elongated portions running parallel to each other and which change direction along the surface in and curved portions, the p-type top layer being formed only in the straight portions, the n-type drain region being formed overlapping the p-type top layer.

Though the above mentioned substrate, regions and layers have specific conductivity from that described, they may have opposite conductivity.

In accordance with the present invention, it is possible to enhance a breakdown voltage of curve portions of a layout pattern by improving a layout of the n-type drain region, and hence, it is also possible to increase the breakdown voltage of an entire MOSFET semiconductor device. For instance, it is possible to increase the breakdown voltage in the vicinity of the curved portions from 400 V to 600 V which is equal to the breakdown voltage of the straight portions, thereby providing the advantage that a MOSFET semiconductor device can have a breakdown voltage of 600 V.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 1A:
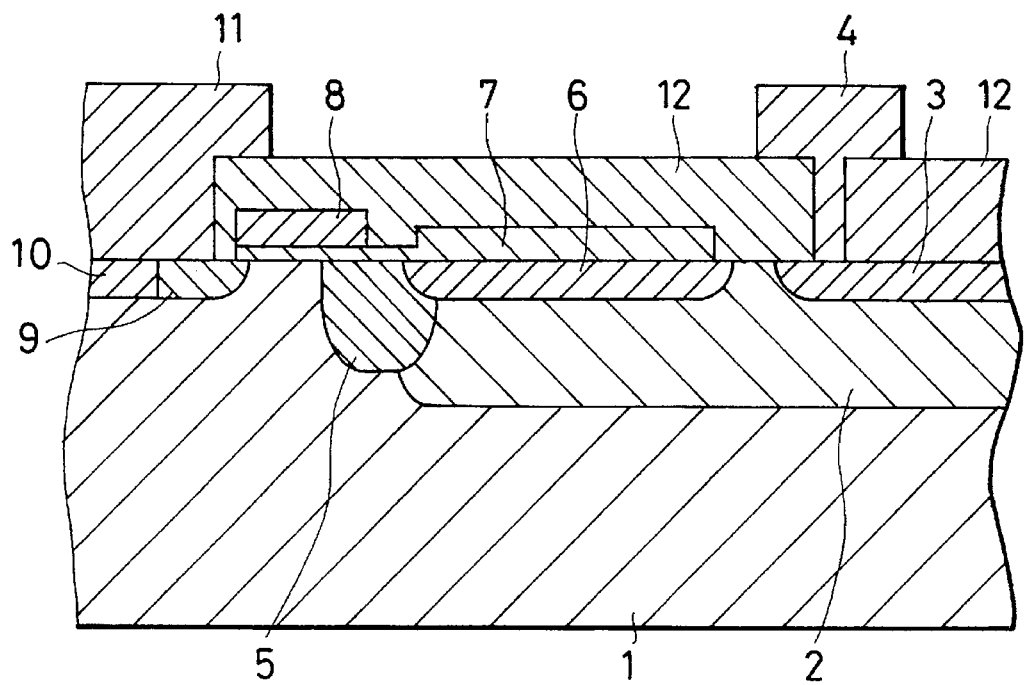
FIG. 1A is a common cross-sectional view taken along the lines A—A and B—B in FIG. 1B.
Figure 1B:
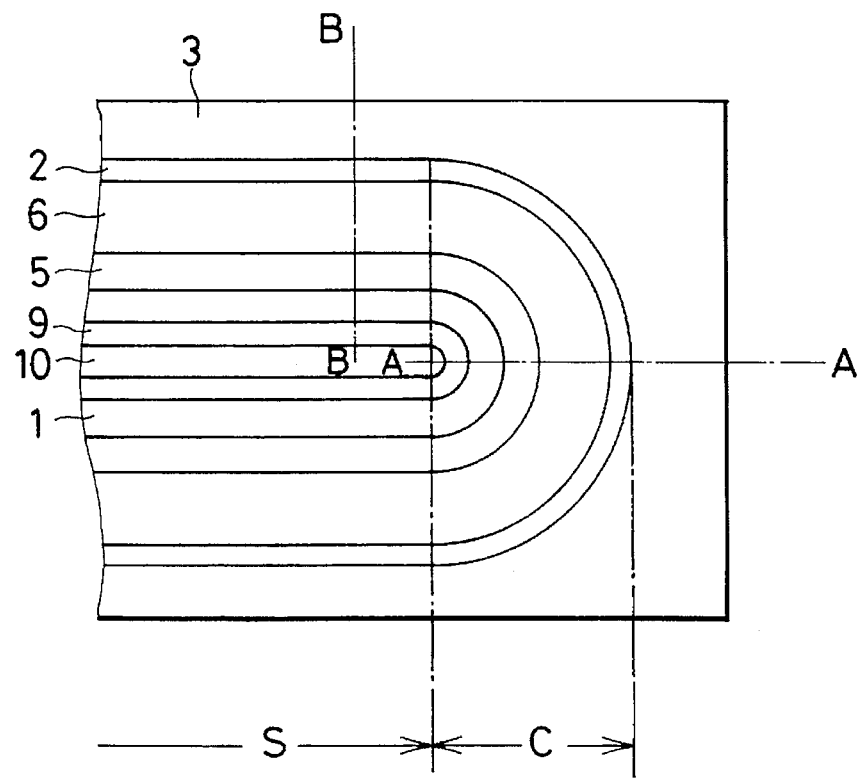
FIG. 1B is a plan view illustrating a layout pattern of a conventional MOSFET semiconductor device.
Figure 1C:
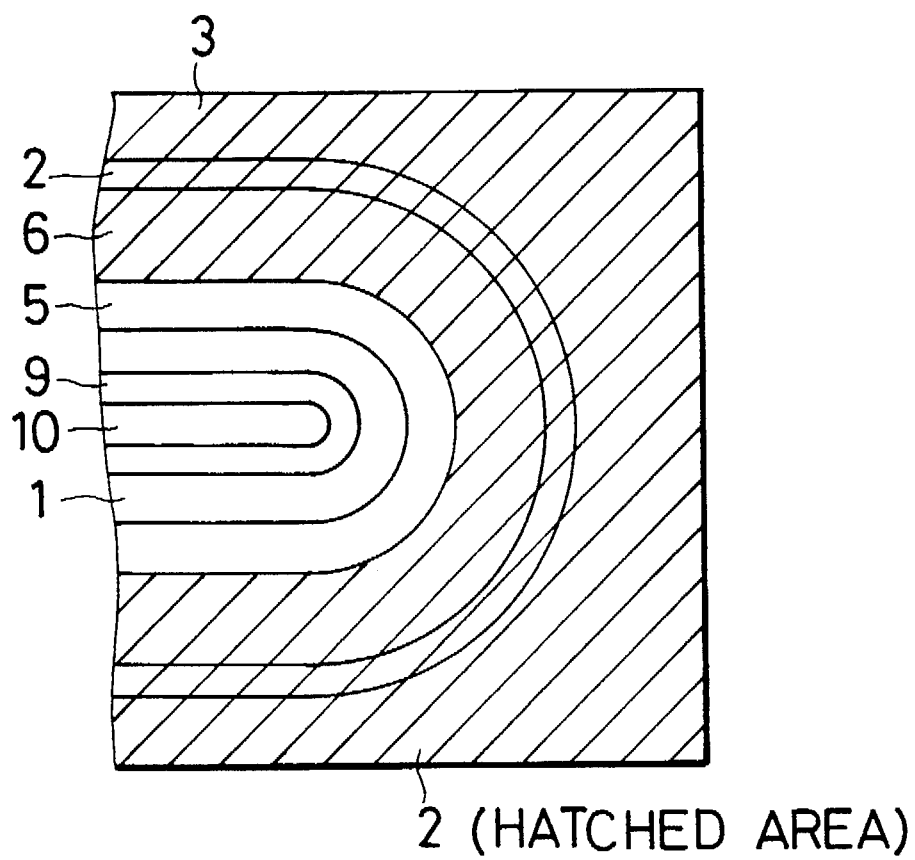
FIG. 1C is a plan view of a conventional MOSFET semiconductor device, showing an area in which an n-type drain region is to be formed.
Figure 2:
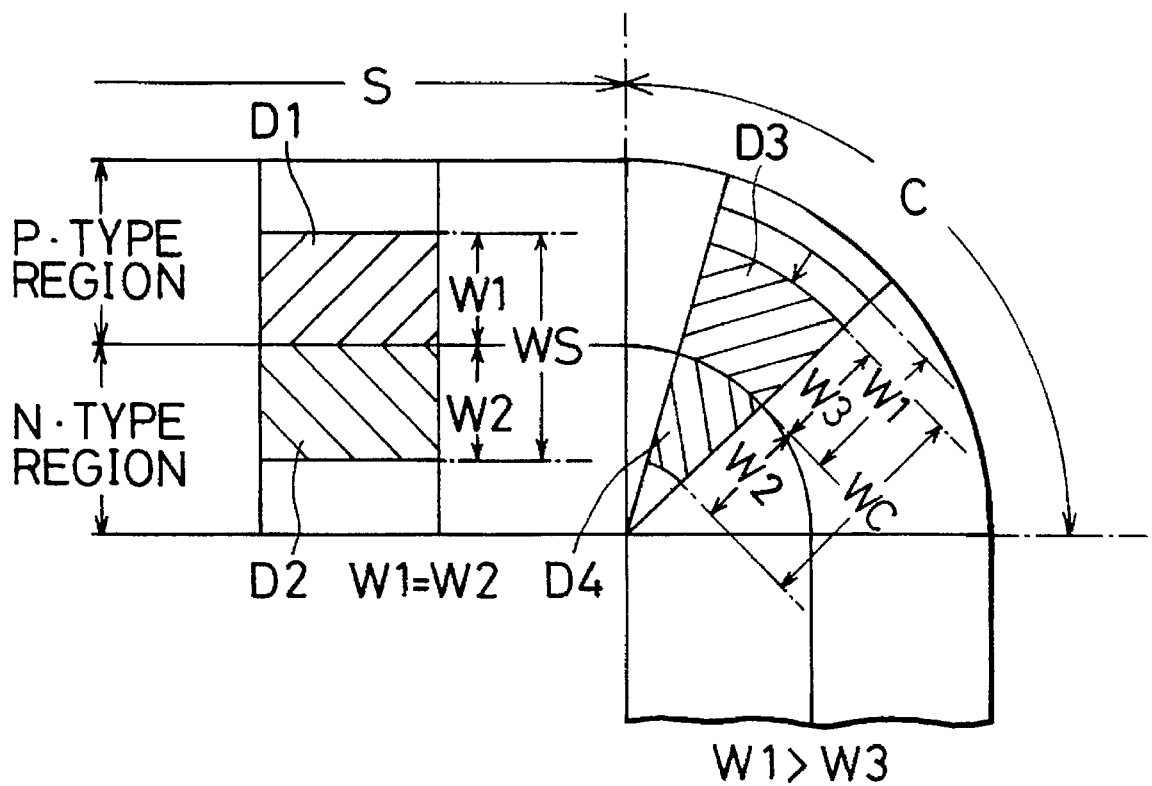
FIG. 2 is a schematic plan view of a conventional MOSFET semiconductor device, showing the width of depletion layers.
Figure 3A:
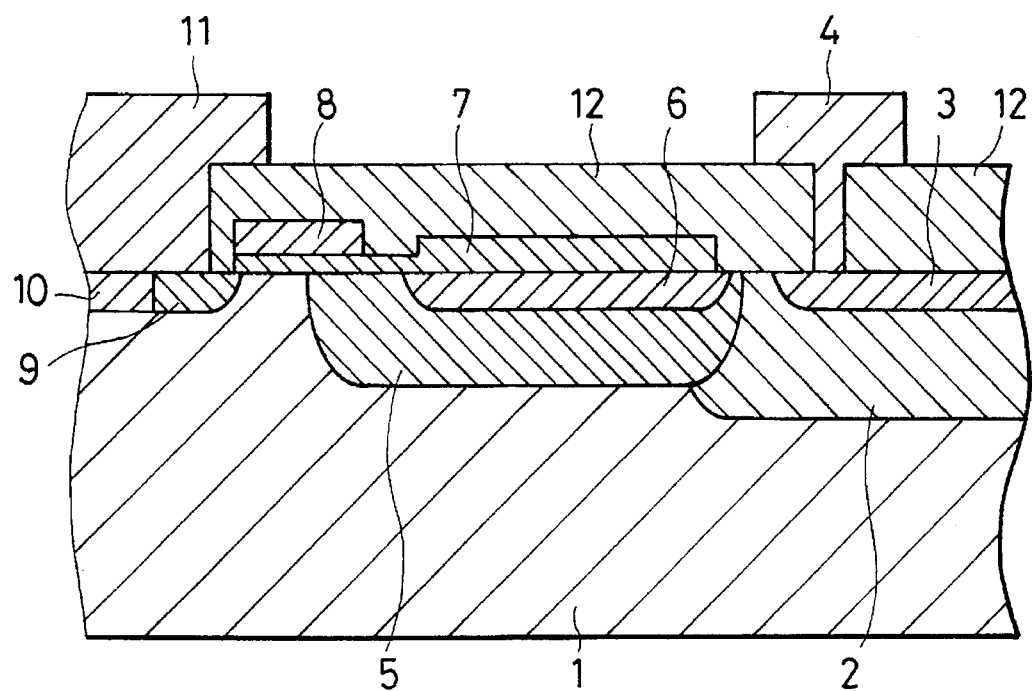
FIG. 3A is a cross-sectional view taken along the line A—A in FIG. 3B.
Figure 3B:
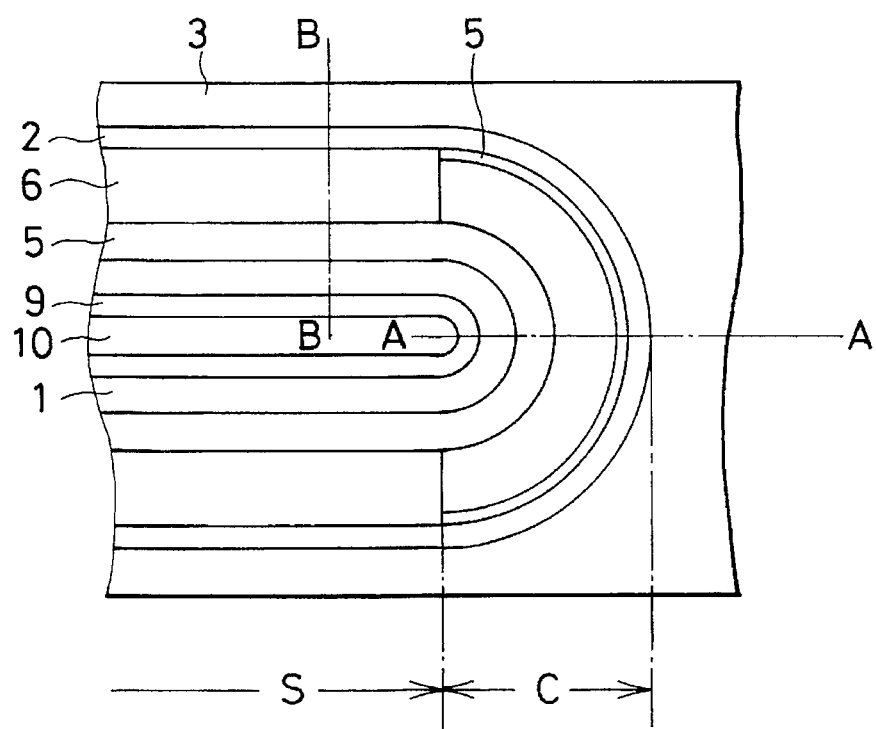
FIG. 3B is a plan view illustrating a layout pattern of a MOSFET semiconductor device made in accordance with the first embodiment of the present invention.
Figure 4:
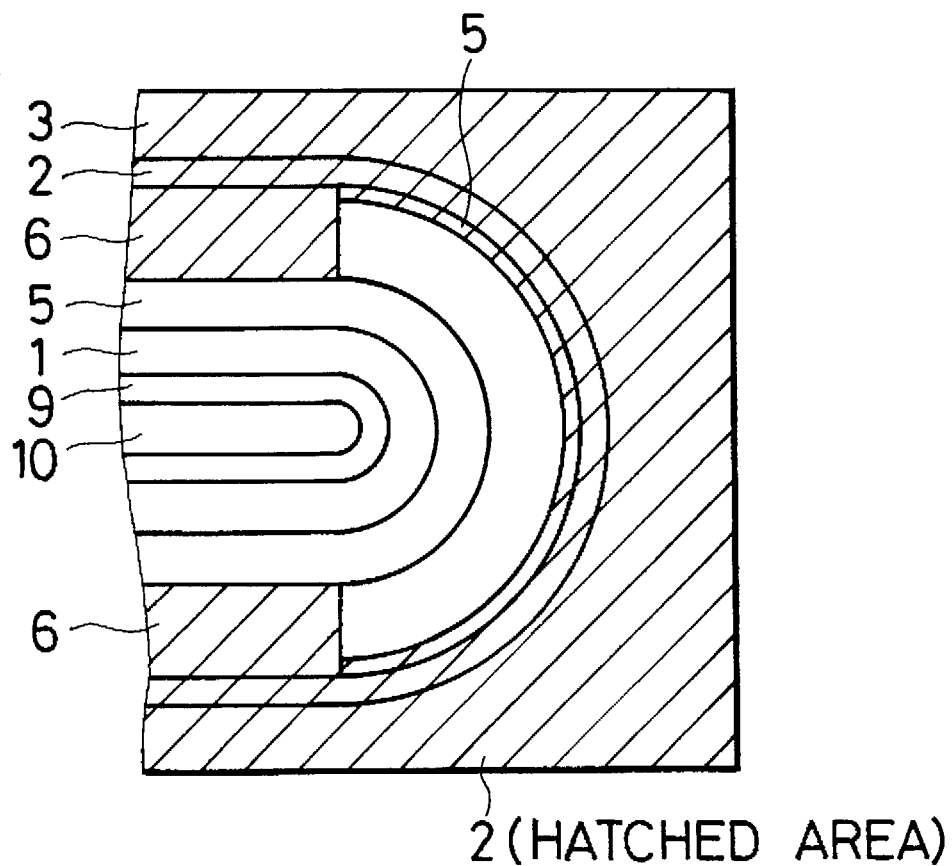
FIG. 4 is a plan view similar to FIG. 3B, showing an area in which an n-type drain region is to be formed.

A MOSFET semiconductor device made in accordance with the first embodiment of the present invention is illustrated in FIGS. 3A, 3B and 4, in which FIG. 3B is a plan view illustrating a layout pattern of the MOSFET semiconductor device, FIG. 3A is a cross-sectional view taken along the line A—A in FIG. 3B, and FIG. 4 is a plan view showing an area in which an n-type drain region is to be formed. A cross-section of the MOSFET semiconductor device taken along the line B—B in FIG. 3B is the same as a cross-section illustrated in FIG. 1A.

As illustrated in FIG. 3A, the MOSFET semiconductor device includes a p-type substrate 1 having the resistivity of 40 Ω·cm which is comprised of an n-type drain region 2 having a peak content of $1.5 \times 10^{-16}$ cm⁻³ and a depth of 8 μm, an n⁺-type drain layer 3 located within the n-type drain region 2 and located at a surface of the p-type substrate 1, an n⁻-type drain region 5 located adjacent to the n-type drain region 2 and having a peak content of $1\times10^{-16}$ cm$^{-3}$ and a depth of 7.5 μm, a p-type top layer 6 located within the n$^-$-type drain region 5 and at a surface of the p-type substrate 1, and having a depth of 0.5 μm, an n$^+$-type source region 9 spaced away from the n$^-$-type drain region 5 and located at a surface of the p-type substrate 1, and a p$^+$-type back gate 10 located adjacent to the n$^+$-type source region 9 and at a surface of the p-type substrate 1.

An insulating film 7 is formed on a surface of the p-type substrate 1, covering the p-type top layer 6, the n$^-$-type drain region 5 and an exposed surface of the p-type substrate 1. On the insulating film 7 is formed a gate electrode 8 bridging over the n$^-$-type drain region 5 and the n$^+$-type source region 9. The p-type substrate 1 is covered with an interlayer insulating film 12, on which there are formed a drain electrode 4 communicating to the n$^+$-type drain layer 3, and a source electrode 11 communicating to both the n$^+$-type source region 9 and the p$^+$-type back gate 10.

As illustrated in FIG. 3B, a layout pattern to be arranged on a chip, which is constituted of the above mentioned regions 2, 5 and 9, layers 3 and 6, p$^+$-type back gate 10, is comprised of elongated straight portions S which change directions along the surface, thereby forming a curved portion C.

As viewed from above, the layout pattern centrally includes the p$^+$-type back gate 10 which is surrounded with the n$^+$-type source region 9, the p-type substrate 1, the n$^-$-type drain region 5, the p-type top layer 6, the n$^-$-type drain region 5 which is present again only in the vicinity of the curved portion C, the n-type drain region 2 and the n$^+$-type drain layer 3 in this order.

The n-type drain region 2 is formed so that the n-type drain region 2 overlaps the p-type top layer 6 in the straight portions S of the layout pattern, but does not overlap the p-type top layer 6 in the curved portion C of the layout pattern. Specifically, the n-type drain region 2 is formed in such an area as illustrated in FIG. 4 with hatching.

When a voltage is applied across the n$^+$-type drain region 3 and both the n$^+$-type source region 9 and the p$^+$-type back gate 10, a voltage is also applied across the n$^-$-type drain region 5 and both the p-type substrate 1 and the p-type top layer 6, causing an expanded depletion layer in the n$^-$-type drain region 5. The breakdown voltage between the n$^-$-type drain region 5 and both the p-type substrate 1 and the p-type top layer 6 in the curved portion C is equal to or greater than the breakdown voltage between the n-type drain region 2 and both the p-type substrate 1 and the p-type top layer 6 because of a difference in content between the n$^-$-type drain region 5 and the n-type drain region 2. For instance, according to experiments, it is possible to cause the former breakdown voltage to be equal to or greater than 600 V.

The above mentioned first embodiment makes it possible to increase the breakdown voltage in the curved portion C, by which the breakdown voltage of an entire MOSFET semiconductor device can be increased. The first embodiment provides an additional advantage that a channel is formed beneath the gate electrode 8 even where the elongated regions change direction, i.e., in in the curved portion C when the MOSFET semiconductor device is turned on, and hence the resistance between the n$^-$-type drain region 5 and the n$^+$-type source region 9 can need not become increased.

Figure 5A:
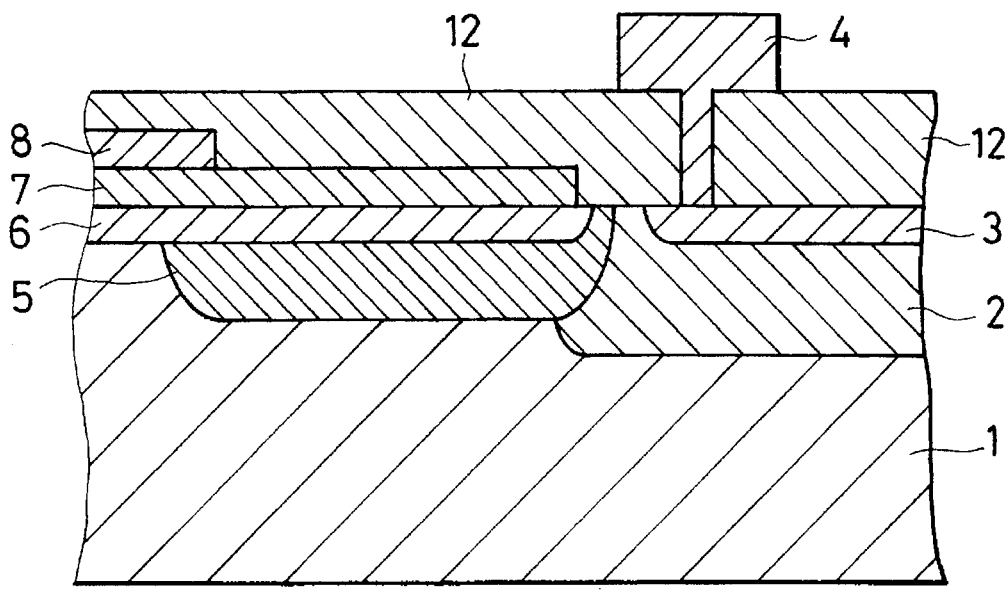
FIG. 5A is a cross-sectional view taken along the line A—A in FIG. 5B.
Figure 5B:
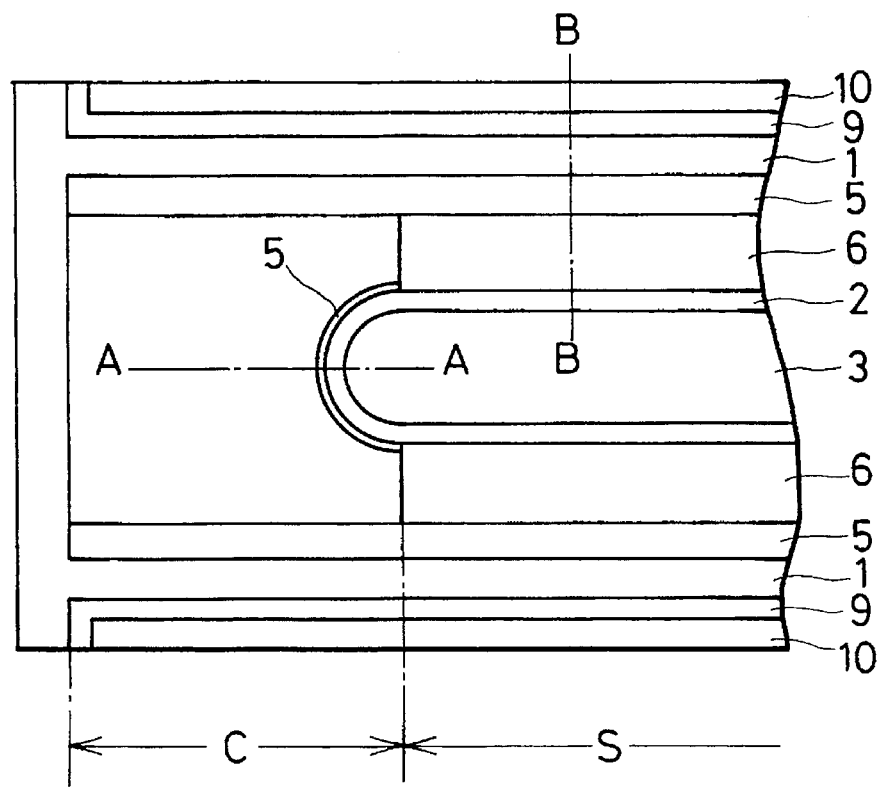
FIG. 5B is a plan view illustrating a layout pattern of a MOSFET semiconductor device made in accordance with the second embodiment of the present invention.
Figure 6:
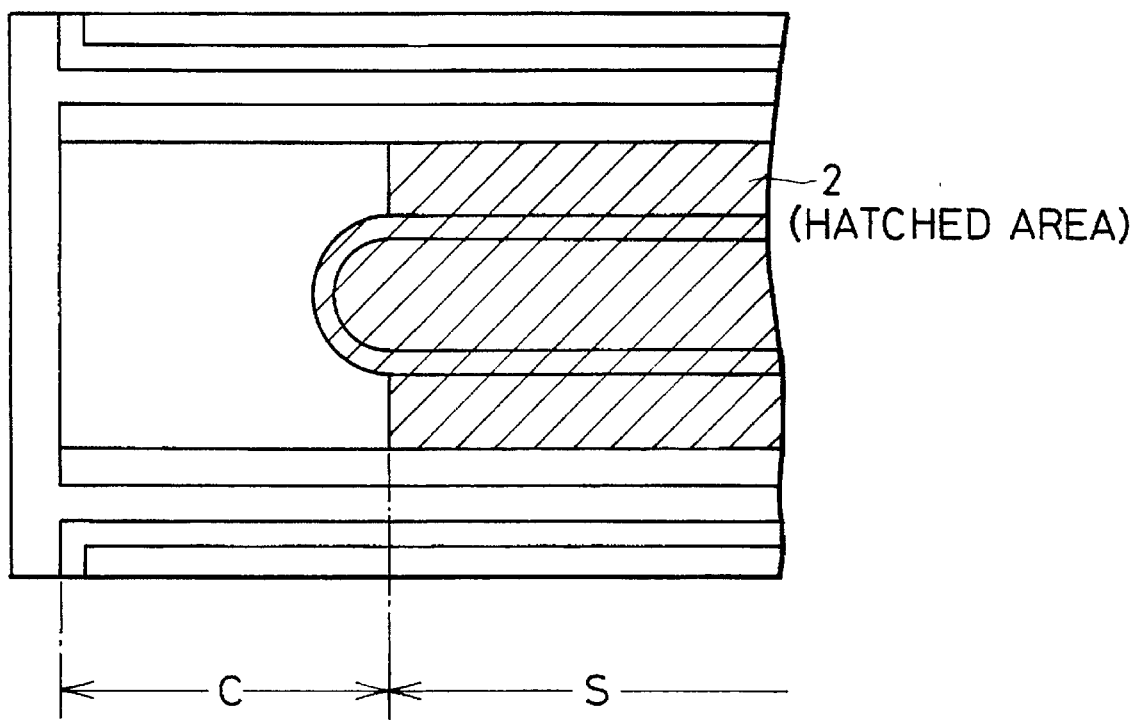
FIG. 6 is a plan view similar to FIG. 5B, showing an area in which an n-type drain region is to be formed.

A MOSFET semiconductor device made in accordance with the second embodiment of the present invention is illustrated in FIGS. 5A, 5B and 6, in which FIG. 5B is a plan view illustrating a layout pattern of the MOSFET semiconductor device, FIG. 5A is a cross-sectional view taken along the line A—A in FIG. 5B, and FIG. 6 is a plan view showing an area in which an n-type drain region is to be formed. A cross-section of the MOSFET semiconductor device taken along the line B—B in FIG. 5B is the same as a cross-section illustrated in FIG. 1A.

As illustrated in FIG. 5A, the MOSFET semiconductor device has the same structure as the first embodiment illustrated in FIG. 3A except that the p-type top layer 6 is not surrounded by the n$^-$-type drain region 5, but extends through the n$^-$-type drain region 5 at a surface of the p-type substrate 1.

As viewed from above, the layout pattern of the MOSFET semiconductor device of the second embodiment centrally includes the n$^+$-type drain layer 3 which is surrounded with the n-type drain region 2 and the p-type top layer 6. As illustrated in FIG. 5B, outside the p-type top layer 6 are arranged the n$^-$-type drain region 5, the p-type substrate 1, the n$^+$-type source region 9 and the p$^+$-type back gate 10 in this order at each of opposite sides of the p-type top layer 6.

In the second embodiment, a straight elongated portion S and a curved portion C where the regions change direction along the surface are constituted only of the n$^+$-type drain layer 3, the n-type drain region 2 and the p-type top layer 6. The n-type drain region 2 in the second embodiment is designed to be present beneath only the n$^+$-type drain layer 3 and the p-type top layer 6 located in the straight portion S of the layout pattern, as illustrated in FIG. 6 with hatching.

The above mentioned second embodiment can increase the breakdown voltage in the vicinity of the curved portion C, by which a breakdown voltage of an entire MOSFET semiconductor device can be increased, similarly to the first embodiment.

Figure 7A:
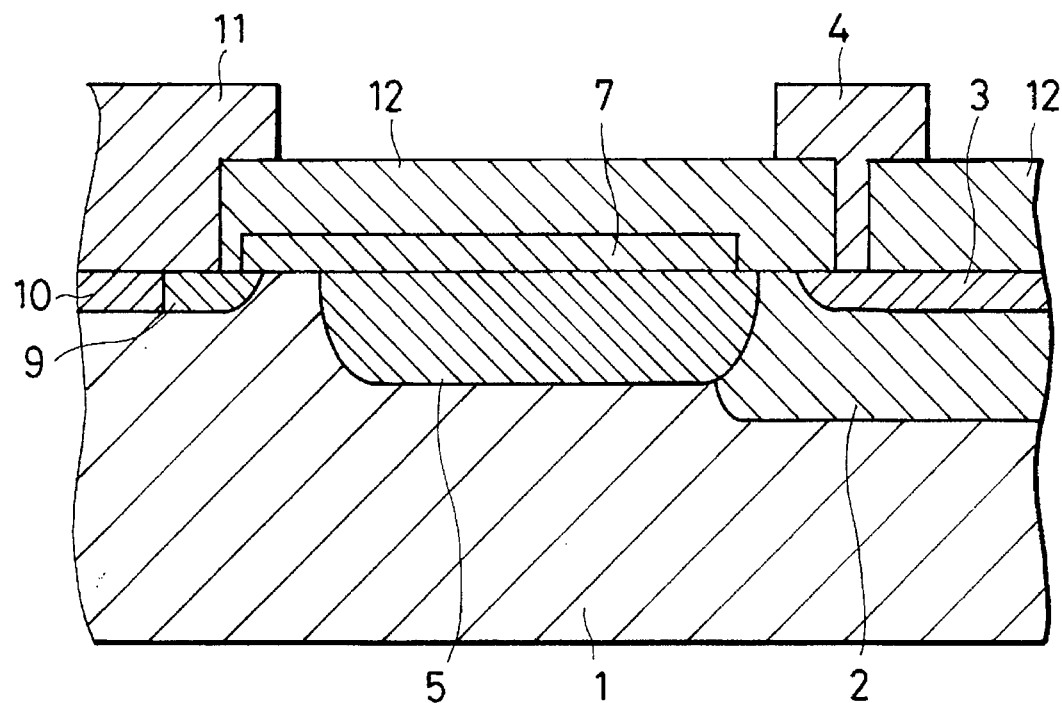
FIG. 7A is a cross-sectional view taken along the line A—A in FIG. 7B.
Figure 7B:
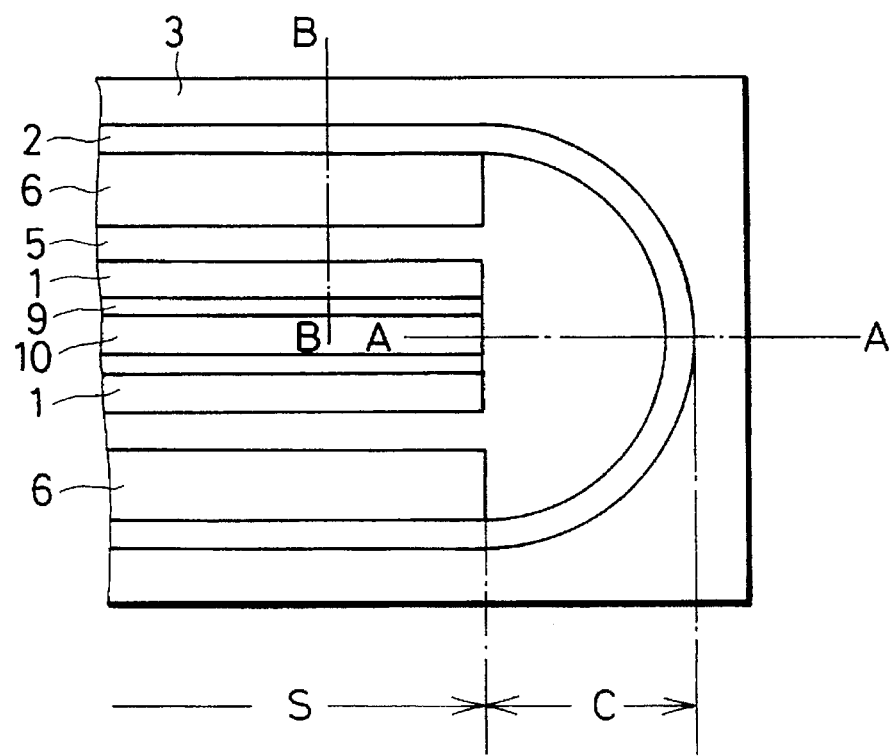
FIG. 7B is a plan view illustrating a layout pattern of a MOSFET semiconductor device made in accordance with the third embodiment of the present invention.
Figure 8:
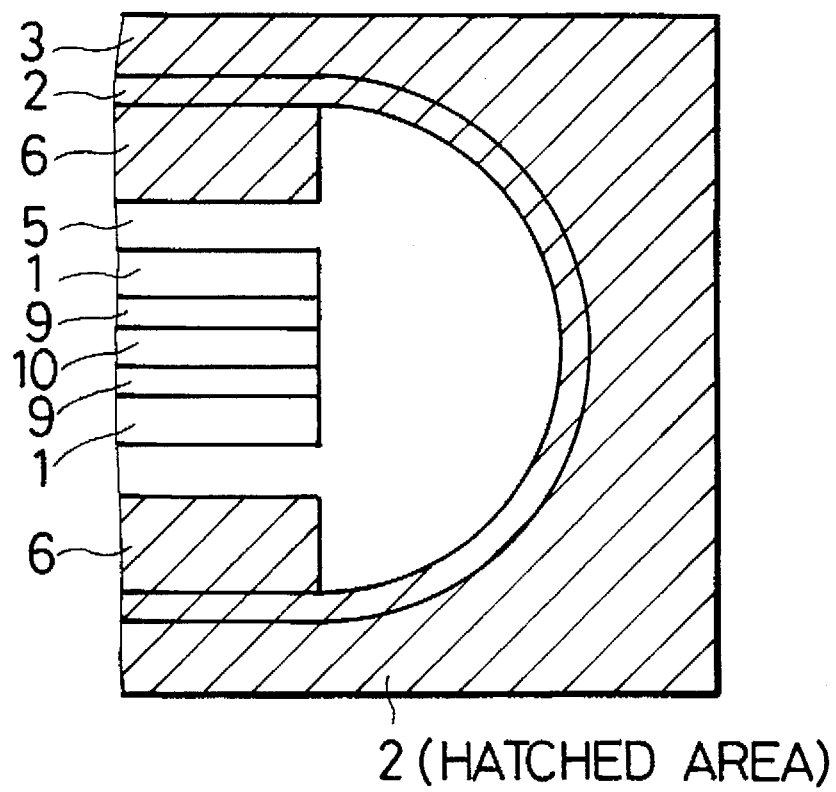
FIG. 8 is a plan view similar to FIG. 7B, showing an area in which an n-type drain region is to be formed.

A MOSFET semiconductor device made in accordance with the third embodiment of the present invention is illustrated in FIGS. 7A, 7B and 8, in which FIG. 7B is a plan view illustrating a layout pattern of the MOSFET semiconductor device, FIG. 7A is a cross-sectional view taken along the line A—A in FIG. 7B, and FIG. 8 is a plan view showing an area in which an n-type drain region is to be formed. A cross-section of the MOSFET semiconductor device taken along the line B—B in FIG. 8B is the same as a cross-section illustrated in FIG. 1A.

As illustrated in FIGS. 7A and 7B, the MOSFET semiconductor device has the same structure as the first embodiment illustrated in FIG. 3A except that the p-type top layer 6, the n$^+$-type source region 9 and the p$^+$-type back gate 10 are not formed in the curved portion S, but formed only in the straight elongated portion S, and that the gate electrode 8 is not provided. Thus, as illustrated in FIG. 7B, the junction in the vicinity of the curved portion C is composed only of the n$^-$-type drain region 5 and the n-type drain region 2.

The n-type drain region 2 in the third embodiment is designed to be present only beneath the p-type top layer 6 in the straight portion S of the layout pattern, which is not present at all in the area proximate to the curved portion C, as illustrated in FIG. 8 with hatching.

In accordance with the third embodiment, it is possible to increase a breakdown voltage in the curved portion C, even if the p-type top layer 6 is not formed in the curved portion C. Since the third embodiment has no gate electrode and hence no channel is formed in the curved portion C, the resistance between the n$^-$-type drain region 5 and the n$^+$-type source region 9 is greater than that of the first embodiment. However, the n$^-$-type drain region 5 causes a current to run from channels formed in the straight portion S into the n⁻-type drain region 5 located in the curved portion C. Thus, the resistance between the n⁻-type drain region 5 and the n⁺-type source region 9 in the third embodiment is smaller than that of the semiconductor device disclosed in U.S. Pat. No. 5,258,636. The third embodiment also provides the advantage of a simpler structure than the first embodiment.

Though the substrate, regions, layers and the like in the above mentioned first to third embodiment have specific conductivity, it should be noted that they may have opposite conductivity.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A MOSFET semiconductor device comprising a p-type substrate, said p-type substrate including:
an n-type drain region;
an n⁻-type drain region located adjacent to said n-type drain region;
an n+-type drain layer located within said n-type drain region and at a surface of said p-type substrate;
a p-type top layer located adjacent to said n⁻-type drain region and at a surface of said p-type substrate;
an n+-type source region; and
a p+-type back gate,
a layout pattern constituted of said regions and layers including at least a pair of said regions and layers having elongated portions substantially parallel to each other and which change direction along said surface so as to form a curved portion,
said n⁻-type drain region covering therein said p-type top layer therewith in an area proximate to said curved portions of said layout pattern,
said n-type drain region being formed so that said n-type drain region overlaps said p-type top layer in said elongated portions of said layout pattern and does not overlap said p-type top layer in said area proximate to said curved portions of said layout pattern.

2. The MOSFET semiconductor device as set forth in claim 1, wherein said substrate, regions and layers have opposite conductivity.

3. The MOSFET semiconductor device as set forth in claim 1, wherein said n+-type drain layer, said n-type drain region, said p-type top layer, said n⁻-type drain region, said p-type substrate, said n+-type source region, and said p+-type back gate are arranged in this order when said layout pattern is viewed from above, said p+-type back gate being disposed inwardly toward the center of a radius in said curved portions of said layout pattern.

4. The MOSFET semiconductor device as set forth in claim 3, wherein said substrate, regions and layers have opposite conductivity.

5. The MOSFET semiconductor device as set forth in claim 1, wherein said n-type drain region is located surrounding said n+-type drain layer and said p-type top layer is located surrounding said n-type drain region, and said n⁻-type drain region, said p-type substrate, said n+-type source region, said p+-type back gate are arranged outside said p-type top layer in this order, said n-type drain region being located beneath said n+-type drain layer and said p-type top layer only in the elongated portions outside of said area proximate to said curved portions of said layout pattern.

6. The MOSFET semiconductor device as set forth in claim 5, wherein said substrate, regions and layers have opposite conductivity.

7. A MOSFET semiconductor device comprising a p-type substrate, said p-type substrate including:
an n-type drain region;
an n⁻-type drain region located adjacent to said n-type drain region;
an n+-type drain layer located within said n-type drain region and at a surface of said p-type substrate;
a p-type top layer located adjacent to said n⁻-type drain region and at a surface of said p-type substrate;
an n+-type source region; and
a p+-type back gate,
a layout pattern constituted of said regions and layers including at least a pair of said regions and layers having elongated portions substantially parallel to one another and which change direction along said surface forming a curved portion,
said p-type top layer being formed only in said elongated portions outside of an area proximate to said curved portions,
said n-type drain region being formed overlapping said p-type top layer.

8. The MOSFET semiconductor device as set forth in claim 7, wherein said substrate, regions and layers have opposite conductivity.

* * * * *